United States Patent [19]
Ximen et al.

[11] Patent Number: 5,700,526
[45] Date of Patent: Dec. 23, 1997

[54] INSULATOR DEPOSITION USING FOCUSED ION BEAM

[75] Inventors: Hongyu Ximen; Michael A. Cecere; Douglas Masnaghetti, all of San Jose, Calif.

[73] Assignee: Schlumberger Technologies Inc., San Jose, Calif.

[21] Appl. No.: 434,548

[22] Filed: May 4, 1995

[51] Int. Cl.$^6$ ................................................. C23C 14/10
[52] U.S. Cl. ..................... 427/527; 427/529; 427/563; 427/99
[58] Field of Search .................. 427/527, 529, 427/563, 564, 99

[56] References Cited

U.S. PATENT DOCUMENTS

| | | | |
|---|---|---|---|
| 4,868,068 | 9/1989 | Yamaguchi et al. | 428/596 |
| 5,083,033 | 1/1992 | Komano et al. | 427/585 |
| 5,086,230 | 2/1992 | Adachi et al. | |
| 5,104,684 | 4/1992 | Tao et al. | 427/526 |
| 5,140,164 | 8/1992 | Talbot et al. | |
| 5,149,974 | 9/1992 | Kirch et al. | 250/492.2 |
| 5,236,547 | 8/1993 | Takahashi et al. | 156/628 |
| 5,273,849 | 12/1993 | Harriot et al. | 430/5 |
| 5,429,995 | 7/1995 | Nishiyama et al. | 437/238 |

OTHER PUBLICATIONS

H. Komano et al. in *Silicon Oxide Film Formation by Focused Ion Beam (FIB)–Assisted Deposition*, Japanese Journal of Applied Physics, vol. 28, No. 11, Nov. 1989, pp. 2372–2375.

W. Thompson, *Applications of Focused Ion Beam Induced Chemistry*, in IMB '94 International Workshop on Ion Micro Beams—Generation and Applications—Abstracts, 9–13 May 1994, one page abstract.

D. Stewart et al., *Focused ion beam deposition of new materials; dielectric films for device modification and mask repair, and tantalum films for x-ray mask repair*, Electron–Beam, Xray, EUV and Ion–Beam Submicrometer Lithography for Manufacturing V, SPIE vol. 2437, pp. 276–283, Jun. 195.

*New—microdeposition of insulating materials enhances fib capabilities*, FEI Focus, FEI Company newsletter, fall 1994, pp. 1 and 6.

*Primary Examiner*—Shrive Beck
*Assistant Examiner*—Tammy L. Oreskovic
*Attorney, Agent, or Firm*—Bruce D. Riter

[57] ABSTRACT

Methods are provided for depositing insulator material at a pre-defined area of an integrated circuit (IC) by: placing an IC in a vacuum chamber; applying to a localized surface region of the integrated circuit at which insulator material is to be deposited a first gas containing molecules of a dissociable compound comprising atoms of silicon and oxygen and a second gas containing molecules of a compound which reacts with metal ions; generating a focused ion beam having metal ions of sufficient energy to dissociate molecules of the first gas; and directing the focused ion beam at the localized surface region to dissociate at least some of the molecules of the first gas and to thereby deposit on at least a portion of the localized surface region a material containing atoms of silicon and oxygen. The dissociable compound comprises atoms of carbon and hydrogen, such as di-t-butoxydiacetoxy-silane. The compound which reacts with metal ions may be carbon tetrabromide or ammonium carbonate.

14 Claims, 9 Drawing Sheets

INSULATOR DEPOSITION USING FOCUSED ION BEAM

BACKGROUND OF THE INVENTION

1. Field of the Invention

The present invention relates to methods and apparatus for depositing insulator material using a focused ion beam, particularly a focused ion beam from a liquid-metal ion source.

2. The Prior Art

Systems for the treatment of integrated circuits and the like with a focused-ion-beam (FIB) are known. FIB systems having a needle and gas source for injecting gas at a surface region of an integrated circuit (IC) where the FIB is directed are also known. See, for example, U.S. Pat. No. 5,140,164, the content of which is incorporated herein by this reference. A FIB system commercially available as the "IDS P2X FIBstation" from Schlumberger Technologies, Inc., San Jose, Calif., has a gas manifold with a plurality of controllable inlet valves and a positionable outlet needle for selectively injecting gases from any of a plurality of gas sources toward an IC surface region to be treated with the FIB.

Various techniques have been developed for using such systems to effect semiconductor IC device-level repair and diagnosis. For example, the FIB can be used to mill away material. The rate and controllability of milling can be enhanced by injecting gases which preferentially mill particular materials, such as dielectric or metal. Such techniques can be used to selectively expose IC structure for probing or examination, cut holes through power and ground planes, and to selectively sever conductors. Techniques are also known for injecting a gas in the presence of the FIB at the IC surface to selectively deposit conductive material. These techniques can be used to construct or reconstruct conductors, and to deposit pads used for mechanical or electron-beam probing.

An important limitation of current FIB techniques is that metal deposition can sometimes make electrical contact where it is not desired. The result can be unintended electrical contact between the deposited metal and exposed conductors surrounding the area of metal deposition. Metal deposition can often be time-consuming, such as when the presence of exposed conductors dictates that metal be deposited along a circuitous route to avoid unintended electrical connections. In many cases it is impossible to safely perform metal deposition at all, and the entire repair operation must be redesigned.

It has been proposed to deposit film as an insulator for IC repair. See H. Komano et al. in *Silicon Oxide Film Formation by Focused Ion Beam (FIB)-Assisted Deposition*, JAPANESE JOURNAL OF APPLIED PHYSICS, Vol. 28, No. 11, Nov. 1989, pages 2372–2375. A film of $SiO_2$ was formed by 60 keV $Si^{2+}$ FIB-assisted deposition. A mixture of tetramethoxysilane ($SI(OCH_3)_4$) and oxygen gases was blown onto a sample surface through a 0.2-mm-inner-diameter nozzle. The beam diameter and current were 0.2 μm and 0.1 nA, respectively. The deposited film with 0.1 μm thickness and 0.7 μm width was reported to consist mainly of silicon and oxygen. The reported resistivity of the deposited film was 2.5 MΩ-cm at 5 volts. The report correctly notes that the resistivity is not high enough for use as an insulator in actual devices.

Also, a silicon-beam apparatus is believed to be inherently more complex than a system having a liquid-metal-ion-source (such as a Ga-ion source) and to have a beam less finely-focused than Ga-ion beam systems. It is unclear whether a silicon-beam apparatus would be suitable for the milling and metal-deposition operations needed for IC repair. Improved techniques for FIB-assisted insulator deposition are needed, preferably techniques which can be implemented in Ga-ion-beam systems now used for milling and metal-deposition in IC repair. The prior art is not believed to show the use of Ga-ion-beam deposition of insulative material, perhaps because the Ga ions are conductive.

SUMMARY OF THE INVENTION

Preferred embodiments of the invention offer methods and apparatus for depositing insulator material at a predefined area of an integrated circuit. Molecules of a compound containing silicon atoms and oxygen atoms are mixed with a reactive gas and injected at the surface region of the IC to be treated, while a FIB is directed at the region. The resulting material selectively deposited at localized regions of the IC surface is highly resisitive.

Insulator deposition in accordance with the invention is useful when repairing a semiconductor IC with a charged-particle beam such as a FIB, thus enabling certain types of repair and minimizing repair time. For example, a FIB system is operated in accordance with the invention to deposit a layer of insulator on top of any exposed metal line, in order to protect the metal line from shorting to other metal lines and to enable any further FIB repair operation.

These and other features of the invention will become apparent to those of skill in the art from the following description and the accompanying drawing figures.

DETAILED DESCRIPTION

Deposition of insulator material in accordance with the invention is illustrated by examples of its use in modification of an IC. Operations which are difficult or impossible to achieve without insulator deposition are made possible in accordance with the invention. An example of such an operation arises when a probe pad is to be deposited which is in electrical contact with a conductor buried beneath a power plane, while keeping the probe pad electrically isolated from the power plane.

Another example of such an operation arises when two lower-level conductors lying beneath a metal power plane are to be electrically connected without making electrical contact with the power plane. One way to do this is to first mill a large "window" through the power plane and through interlayer dielectric material beneath the power plane to expose the conductors. A metal line to act as a "jumper" connecting the two conductors can then be deposited on the interlayer dielectric. The procedure would be time-consuming because considerable material must be milled away to provide a large window. If the exposed edges of the power plane at the window perimeter are too near the deposition area, electrical leakage from the deposited metal to the power plane can result.

The speed and reliability of the procedure can be improved in accordance with the invention by selective deposition of insulator material prior to depositing metal. Two small holes can be milled through the power plane to provide access to the two conductors. The exposed edges of the power plane at the perimeters of the holes can be covered with insulator, assuring electrical isolation even when depositing metal in a smaller window.

Insulator deposition in accordance with the invention can also be used, for example, to avoid unwanted electrical contact with conductive structures when reconnecting a metal signal line after a section of the metal line has been removed.

A FIB system suitable for carrying out the methods of the present invention is the DS P2X FIBstation, available commercially from Schlumberger Technologies, Inc., of San Jose, Calif.

Insulator deposition in accordance with preferred embodiments of the invention is described with reference to examples of applications which are enabled by the ability to deposit insulating material and with reference to examples demonstrating a range of FIB-assisted insulator-deposition parameters.

In the examples, chamber pressures were monitored using the Penning gauge of the P2X FIB station system. Two gases were used. The gas ratio was established by first determining parameters (temperature of the crucible holding a sample of precursor material) required to obtain a given chamber pressure of each gas individually for the given orifice, thereby producing a set of calibration data. Parameters selected from the calibration data are used to produce the desired gas ratio when injecting the mixture of gases. The partial pressures of the individual gases do not represent their exact molecular ratios, but do serve as an accurate reference scale of the gas mixture. Since the gas flux and pressure at the surface of the DUT were not measured, the calibration data and chamber pressures were used as an indirect indicator.

Deposition is conducted by scanning the FIB over a specified "box" (e.g., a region of 5 μm×5 μm or 5 μm×10 μm or other specified dimension) while gas is injected at the surface of the region through a needle. Regardless of the box dimension, 500 horizontal scan lines are used to cover the region, and one full sweep of the box is performed in 30 milliseconds (ms).

EXAMPLE 1.1

Figure 1A:
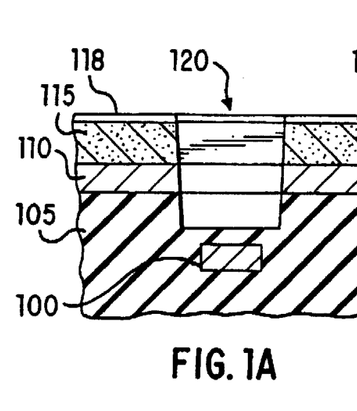
FIGS. 1A, 1B, 1C, and 1D show a sequence of cross-sections of a portion of an IC at various stages of an operation in accordance with the invention.
Figure 1B:
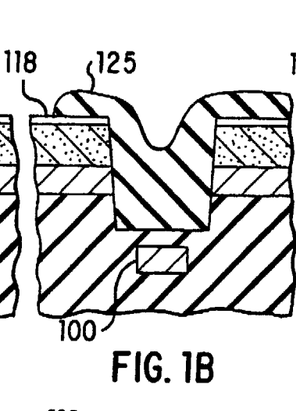
Figure 1C:
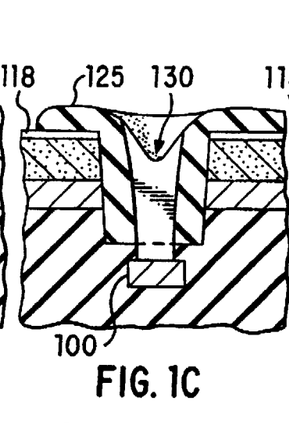
Figure 1D:
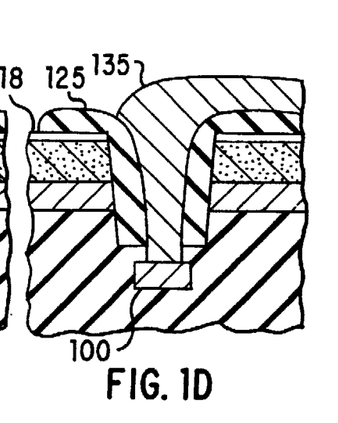
Figure 2A:
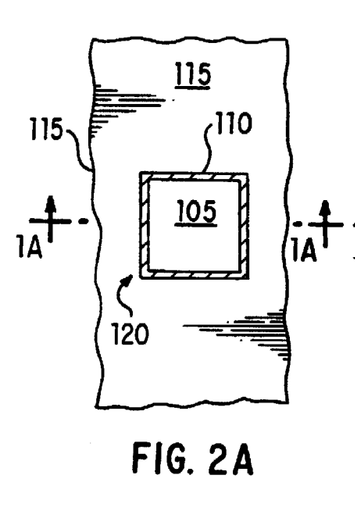
FIGS. 2A, 2B, 2C, and 2D show a sequence of top views of a portion of an IC corresponding respectively to FIGS. 1A–1D.
Figure 2B:
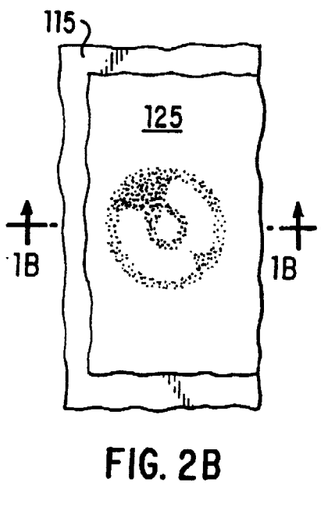

The section views of FIGS. 1A–1D and top views of FIGS. 2A–2D illustrate. In a two-metal-layer CMOS sample device, a conductor 100 surrounded by native silicon dioxide ($SiO_2$) insulation 105 lies beneath a power plane 110 which is in turn covered by a layer 115 of native $SiO_2$ and a passivation layer 118 of native silicon nitride ($Si_3N_4$). A hole 120 of 4 μm×4 μm was milled through the power plane to expose insulation 105, as shown in FIGS. 1A and 2A. Referring to FIGS. 1B and 2B, a 10 μm×10 μm×1 μm pad 125 of insulator material was deposited by directing a focused gallium (Ga) ion beam of 250 pA beam current at 15 keV beam energy for 30 minutes while a precursor gas of $CBr_4$ and DBTS mixed at 1:1 ratio was delivered onto a localized region of the device surface through a 10 cm long gas injector having an 0.8 mm inside diameter. The tip of the injector was maintained at a distance of 0.5 mm from the device surface. The chamber pressure changed from 1e-6 torr prior to deposition to 3e-5 torr during deposition.

The injected gas mixture consisted of: (1) a SiOx precursor gas, $C_{12}H_{24}O_6Si$, Di-T-Butoxydiacetoxy-silane (DBTS), available for purchase from United Chemical Technologies, Inc., Bristol, Pa., and (2) a Ga-bonding gas, $CBr_4$, carbon tetrabromide, available for purchase from Aldrich Chemical, Milwaukee, Wis.

Figure 2C:
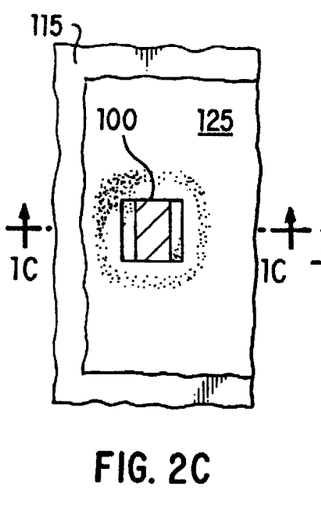

After depositing pad 125, a hole 130 of 2 μm×2 μm was milled through the deposited insulator material and through native $SiO_2$ to expose conductor 100 as shown in FIGS. 1C and 2C. Metal was then deposited to fill hole 130 and to form a bridge 135 in electrical contact with conductor 100 as shown in FIGS. 1D and 2D, and extending over a portion of insulator pad 125 and onto the native $Si_3N_4$.

Figure 2D:
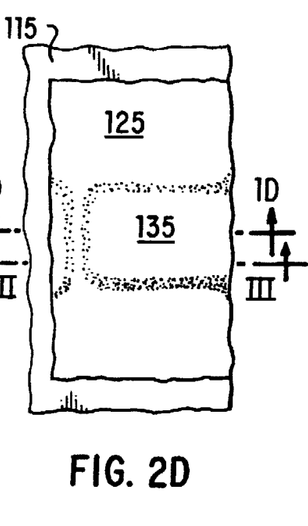
Figure 3:
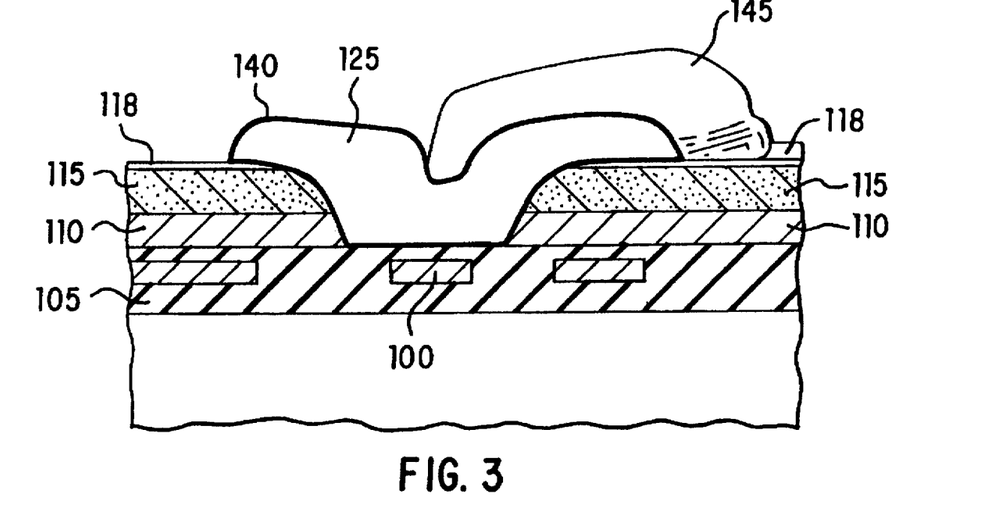
FIG. 3 is an enlarged cross-sectional view taken from a FIB image of an IC modified in accordance with the invention approximately along section line III—III of FIG. 2D.

FIG. 3 is a tracing of a voltage contrast image of a section taken through the deposited insulator material (but not through the deposited conductive material), i.e., along line III—III of FIG. 2D. The deposited insulator material 125 is outlined by the bold line 140 in FIG. 3. The deposited conductive material is visible in section at 145.

Figure 4:
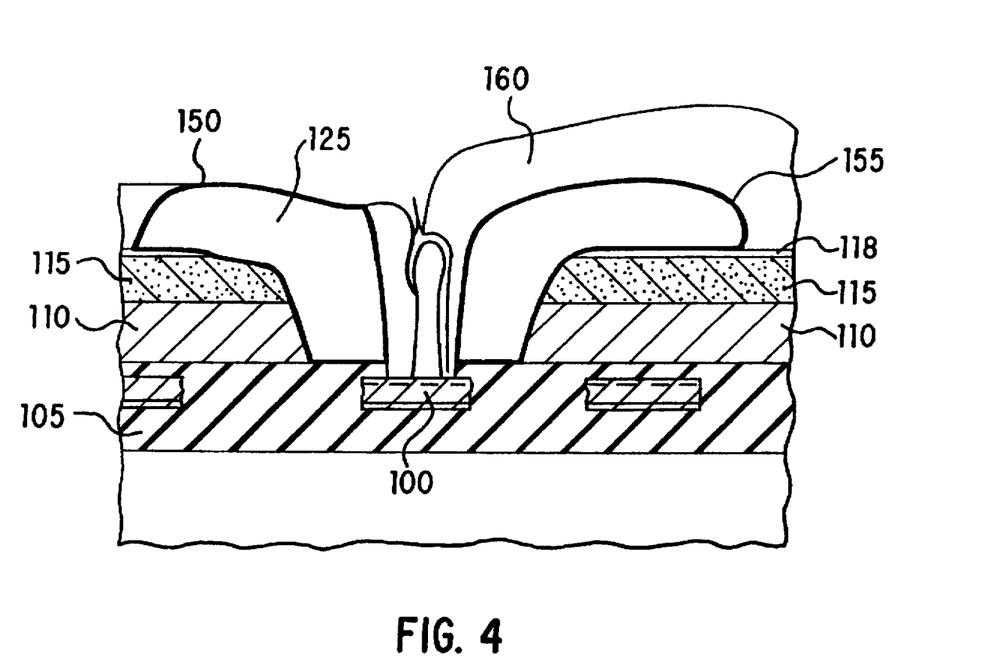
FIG. 4 is an enlarged cross-sectional view taken from a FIB image of an IC modified in accordance with the invention approximately along section line I.D—I.D of FIG. 2D.

FIG. 4 is a tracing of a voltage contrast image of a section taken through the deposited insulator material and conductive material, i.e., along line ID—ID of FIG. 2D. The deposited insulator material 125 is outlined by the bold lines 150 and 155. The deposited conductive material is visible in section at 155.

The example demonstrates the ability to establish contact through power planes or ground planes using a combination of milling, deposition of insulator material in accordance with the invention, and deposition of conductive material. Such contact structures can be used for further jumper formation as needed. The deposited insulator material offers good isolation and good electrical characteristics, verified by acquisition of full 5-volt e-beam waveforms. Any substantial leakage from the lower conductor to power- or ground-planes would result in amplitude of the acquired e-beam waveforms substantially less than 5-volts.

EXAMPLE 1.2

Figure 5A:
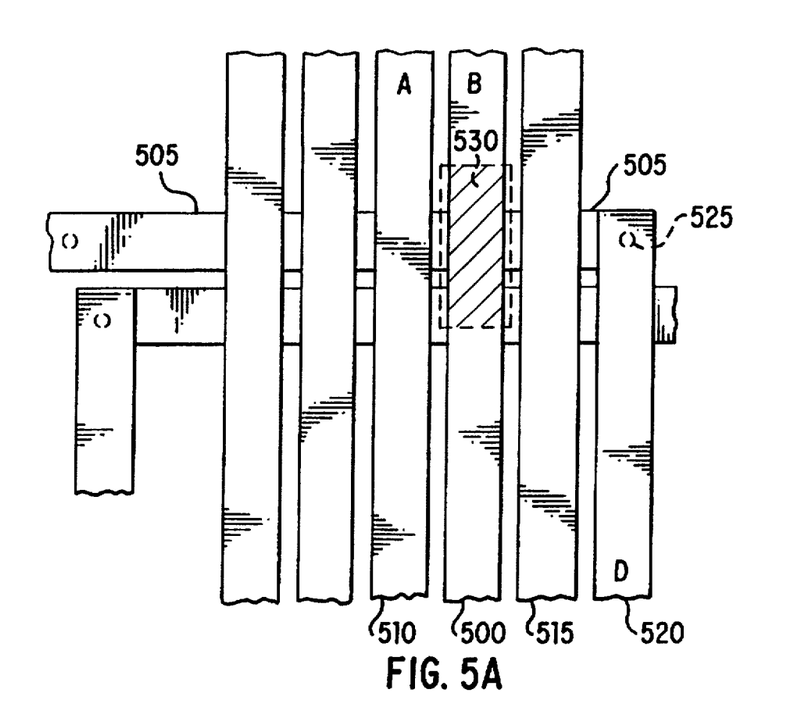
FIGS. 5A, 5B, 5C, and 5D show a series of top views of a portion of an IC at various stages of an operation in accordance with the invention.

Another portion of the two-metal-layer CMOS device was used to demonstrate the ability to cut a top-layer (M2 layer)

conductor to expose a bottom-layer (M1 layer) conductor, and to re-connect the top-layer conductor while using insulator deposition in accordance with the invention to avoid unwanted electrical communication between conductors. FIG. 5A schematically shows the arrangement of conductors in the area modified. For simplicity of illustration, the overlying $SiO_2$ and $Si_3N_4$ layers (e.g., layers 115 and 118 of FIG. 1A) are not shown. At 500 is shown the M2 conductor to be severed to expose M1 conductor 505. With the device in operation, M2 conductor 510 carries signal "A", M2 conductor 500 to be severed carries signal "B", M2 conductor 515 carries signal "C", and M1 conductor 505 and M2 conductor 520 carry signal "D". Conductors 505 and 520 are joined by a via indicated at 525.

First, passivation was removed by FIB milling from a 4 μm×2 μm region of conductor 500 outlined by the dashed lines at 530 in FIG. 5A. Milling was conducted with a beam energy of 30 key and current of 100 pA, the milling rate enhanced by localized injection of dielectric-preferential $XeF_2$ gas during milling.

Figure 5B:
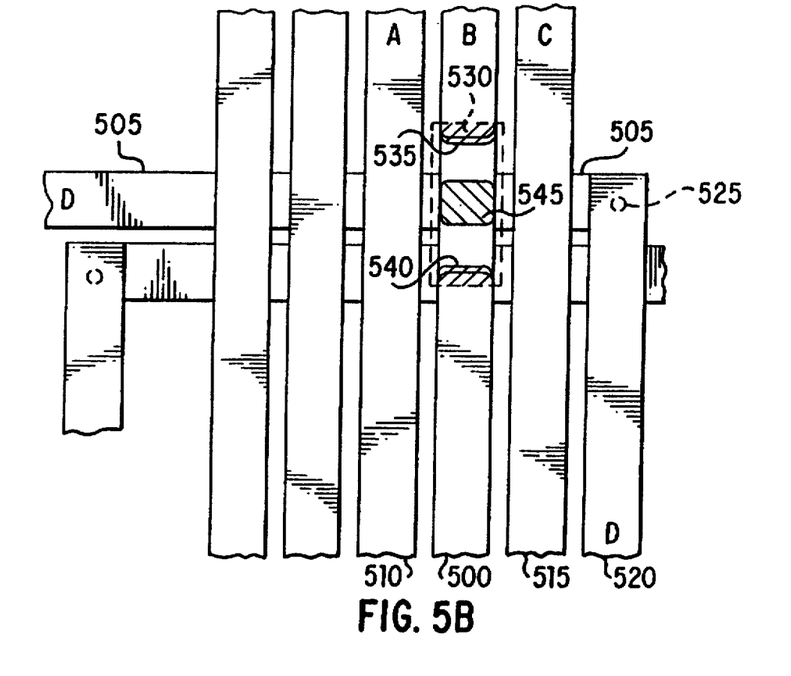

A segment of conductor 500 within the depassivated region was then removed by FIB milling. Milling was conducted with a beam energy of 30 kev and a current of 100 pA, the milling rate enhanced by localized injection of metal-preferential Cl4 gas during milling. FIG. 5B shows exposed cut-ends of severed conductor 500 at 535 and 540. Milling was continued with the injection of dielectric-preferential $XeF_2$ gas to expose M1 conductor 505 in the area outlined at 545.

Figure 5C:
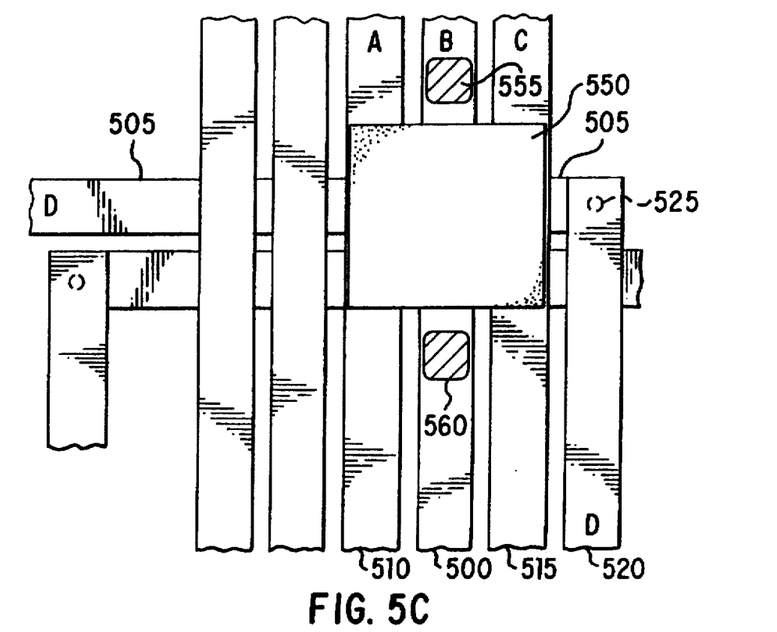

A 10 μm×10 μm patch 550 of insulator material was then deposited to cover the exposed portions of conductors 500 and 505, as shown in FIG. 5C. The insulator material was formed by delivering a 1:1 mixture of DBTS and $CBr_4$ gas at 3e-5 torr pressure onto a localized region of the device surface through a 10 cm long gas injector having an 0.8 mm inside diameter. The tip of the injector was maintained at a distance of 0.5 mm from the device surface. Other parameters of the insulator-deposition were as described above in Example 1.1. A focused beam of gallium ions at an energy of 15 kev and with a beam current of 250 pA was scanned over the region to be covered as the gas was injected.

After depositing the insulator material, milling was resumed to create a 2 μm×2 μm hole 555 and a 2 μm×2 μm hole 560 through the passivation to expose conductor 500 near each of its severed ends. Milling was performed with a beam energy of 30 kev and with a beam current of 20 pA, with localized injection of gas which enhances milling of dielectric. A voltage-contrast FIB image of the device acquired after milling holes 555 and 560 showed the portion of conductor 500 visible through hole 560 substantially darker than the portion of conductor 500 visible through hole 555; this indicated that the portion of conductor 500 visible through hole 560 was electrically floating and that good electrical isolation between the cut ends of conductor 500 was preserved even after deposition of insulator patch 550. Electrical isolation between the cut ends of conductor 500 was confirmed by monitoring the secondary-electron-detector signal during milling. A plot of the signal showed a large amplitude increase as conductor 500 was exposed in hole 555, and a substantially smaller amplitude increase as conductor 500 was exposed in hole 560. The difference between the two amplitude increases was about one order of magnitude.

Figure 5D:
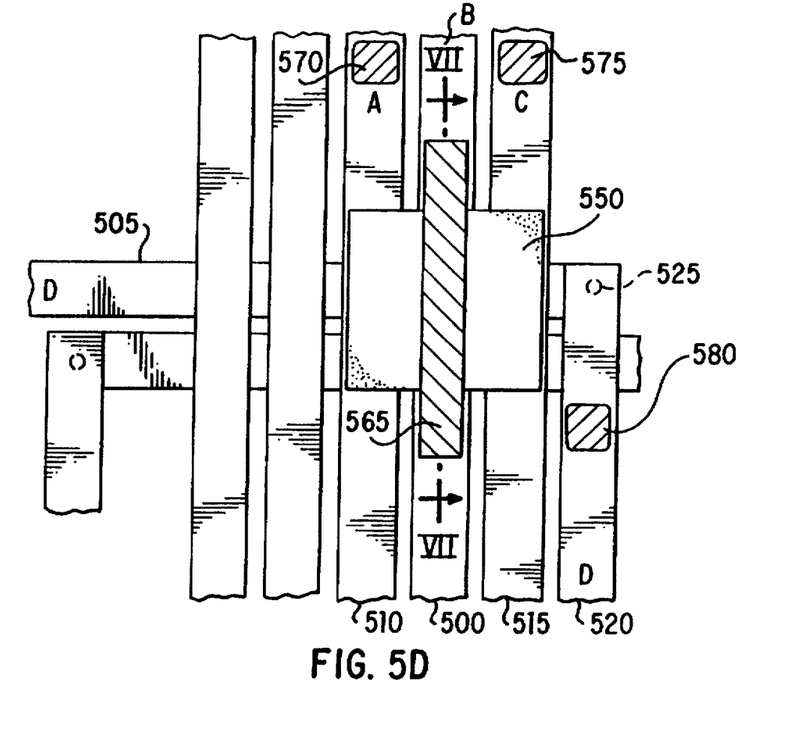

Conductive material was then deposited to fill holes 555 and 560 and form a bridge 565 which extends over insulator pad 550 in electrical contact with conductor 500 at each side of the severed portion, as shown in FIG. 5D.

After depositing the metal bridge, milling was resumed to create a 2 μm×2 μm probe hole 570 through the passivation to expose conductor 510, a 2 μm×2 μm probe hole 575 through the passivation to expose conductor 515, and a 2 μm×2 μm probe hole 580 through the passivation to expose conductor 520. The probe holes were then used to verify electrical properties of the deposited insulator material.

Figure 6:
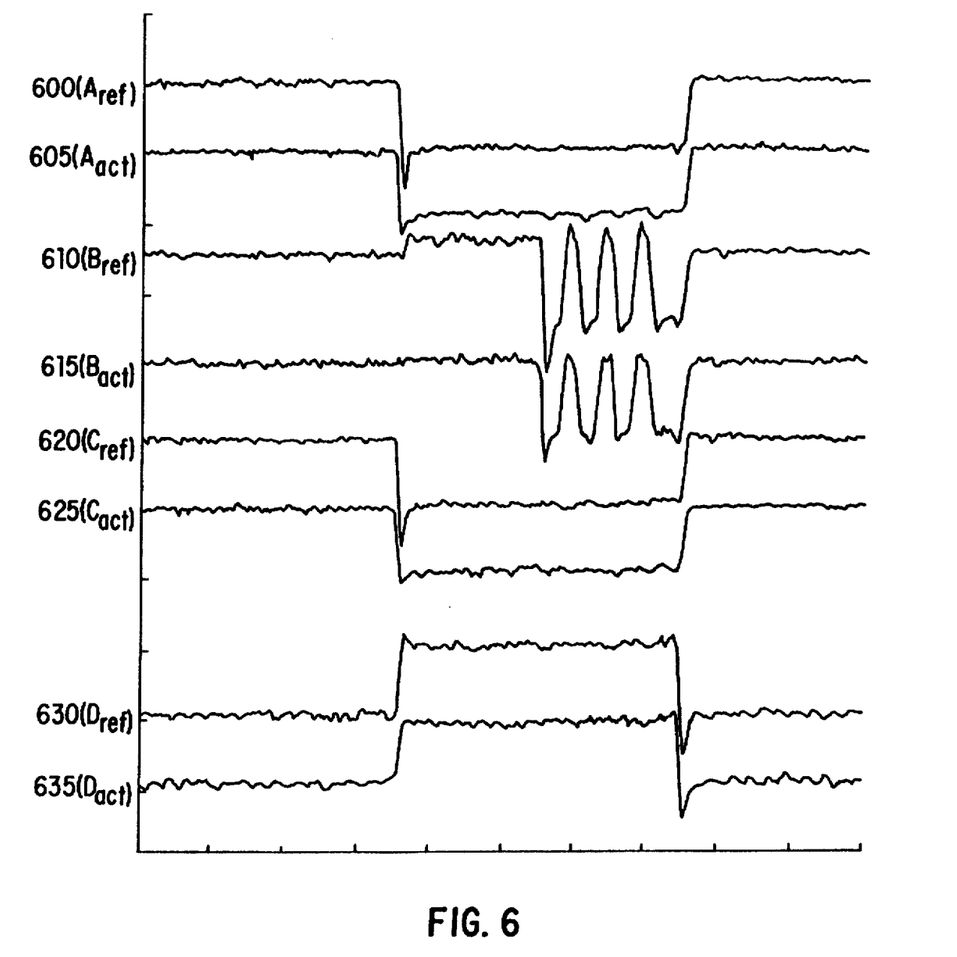
FIG. 6 shows waveforms on selected conductors of the IC of FIGS. 5A–5D before and after modification of the IC in accordance with the invention.

FIG. 6 shows a series of signals acquired from the sample device before and after the operations described above. A set of reference signals was acquired from the sample device in its original state: line 600 is reference signal "A" on conductor 510, line 610 is reference signal "B" on conductor 500, line 620 is reference signal "C" on line 515, and line 630 is reference signal "D" on line 520. A similar set of signals was acquired from the sample device after severing and reconnecting conductor 500: line 605 is signal "A" acquired at probe hole 570, line 615 is signal "B" acquired at bridge 565, line 625 is signal "C" acquired at probe hole 575, and line 635 is signal "D" acquired at probe hole 580. The before and after signals agree favorably, indicating that the deposited insulator pad 550 provides good electrical isolation between conductors 500 and 505, with no influence on the adjacent conductors.

Figure 7:
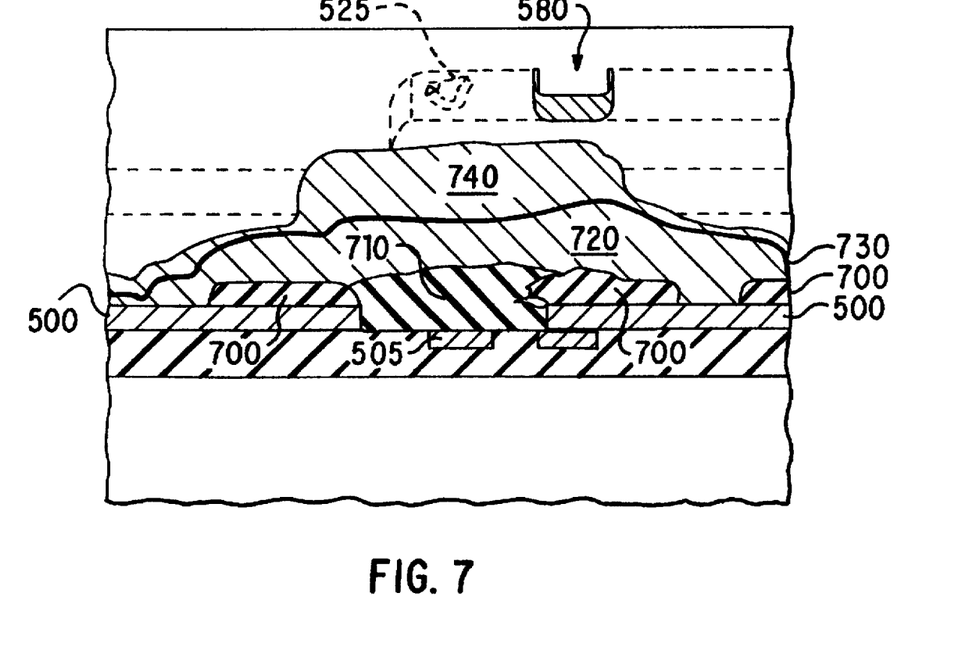
FIG. 7 is a cross-sectional view taken from a FIB image of an IC modified in accordance with the invention approximately along section line VII—VII of FIG. 5D.

The sample device was sectioned through the length of bridge 565 as indicated by line VII—VII in FIG. 5D. A FIB image of the sectioned device was acquired, a line drawing of which is shown in FIG. 7. The image is a tilted, perspective view. The portions shown in section include conductor 505, severed conductor 500, insulative regions 700 of native $SiO_2$ covered with the deposited insulator material, a region of deposited insulator material 710 over conductor 505, and deposited metal bridge 565 at 720. Bold line 730 divides the sectioned portion of the FIB image from the upper portion of the image showing the top surface of the device. Visible in the upper portion of the image are the top surface of bridge 565 at 740, the contour of via 525, and probe hole 580 with an exposed portion of conductor 520. Resistance of the deposited insulator material was estimated from relative brightness of conductors 505 and 500/520 in the FIB image, in which conductor 505 was grounded and conductors 500/520 were electrically floating. The image was acquired with a FIB energy of 30 kev and current of 5 pA. While not a precise indicator, the voltage contrast between conductors 505 and 500 was conservatively estimated to be 1 volt. At 5 pA beam current, resistance of the deposited insulator material was estimated to be 1 volt/5 pA=200 MΩ. Even a voltage contrast of as little as 0.1 volt would give a resistance of 0.1 volt/5 pA=20 MΩ. The actual resistance is believed to be higher than 200 MΩ and perhaps as high as 1 GΩ. Whatever the actual resistance, the signals of FIG. 6 show virtually no signal attenuation under conditions which one would typically encounter in IC diagnosis.

Figure 8:
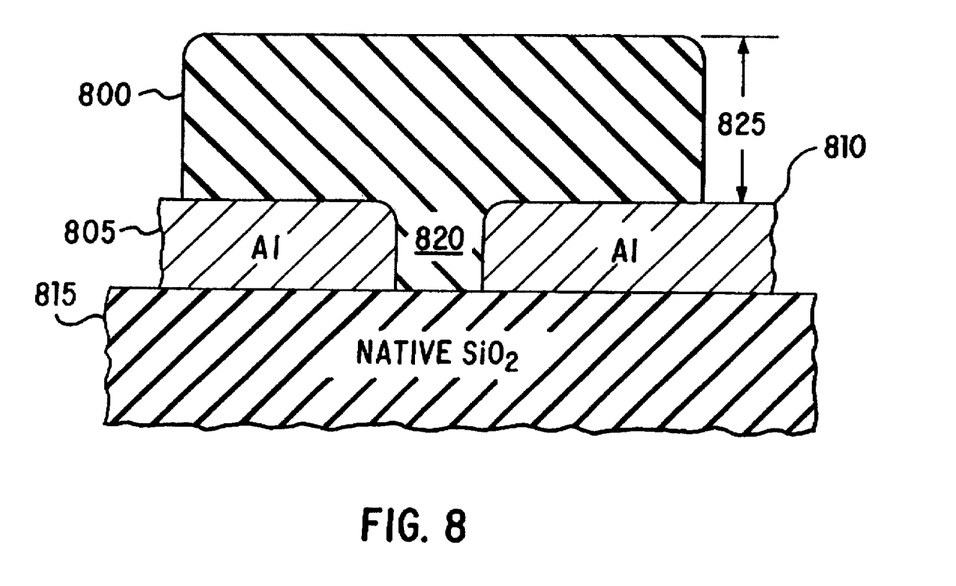
FIG. 8 is a sectional view showing an insulative pad deposited on a test structure of the kind used in Examples 2.1–2.6.

The precursor gas mixture used for FIB-assisted insulator deposition can be a mixture of ammonium carbonate (($NH_3$)$_2CO_3$) and DBTS in accordance with the invention, rather than the precursor gas mixture of $CBr_4$ and DBTS used in Examples 1.1 and 1.2. Examples 2.1–2.6 illustrate. Material deposited using typical parameters (as in Example 2.1) was subjected to Auger spectroscopy analysis, which showed the deposited material consisted entirely of silicon, gallium and oxygen atoms. Referring to FIG. 8, in each of Examples 2.1–2.6 a pad 800 of insulative material of specified dimensions was deposited on a test structure having aluminum conductors 805 and 810 on a native $SiO_2$ layer 815 and having a 1 μm gap 820 between conductors 805 and 810. Conductors 805 and 810 are approximately 1 μm thick. The thickness 825 of the deposited insulator material above the conductors varies from example to example. Resistance between conductors 805 and 810 was measured before depositing pad 800 and at various voltages after depositing pad 800. In some examples, the test structure was sectioned to measure cross-sectional area of pad 800 and bulk resistivity of the deposited insulative material was calculated.

EXAMPLE 2.1

A 6 µm×6 µm pad 800 of insulator material was deposited to a thickness of approximately 1.75 µm by directing a focused gallium (Ga) ion beam of 250 pA beam current at 30 keV beam energy for 20 minutes while a precursor gas of ammonium carbonate and DBTS mixed at 1:1 ratio was delivered onto a localized region of the device surface through a 10 cm long gas injector having an 0.8 mm inside diameter. Partial pressure of each of the ammonium carbonate and DBTS gases was set to 3e-5 Torr chamber pressure (i.e., the crucible for each gas source was held at a temperature which would produce 3e-5 Torr chamber pressure if that gas was being injected by itself). The tip of the injector was maintained at a distance of 0.5 mm from the device surface. Deposition rate of the insulative material was approximately 3 µm$^3$ per minute.

The deposited insulative material was calculated to have a bulk resistivity across the 1 µm gap of approximately 200 MΩ-cm. The deposited pad was observed to have sheer vertical walls, little overspray and uniform, homogeneous deposition.

EXAMPLE 2.2

Deposition parameters for this example were the same as for Example 2.1, except that the DBTS partial pressure was set to 3e-5 Torr and the ammonium carbonate partial pressure was set to 2e-5 Torr, giving a 3:2 chamber-pressure partial pressure ratio between the two components of the gas mixture (more DBTS than ammonium carbonate).

The deposition rate appeared to be somewhat greater than for Example 2.1. The deposited material appeared in a FIB image to be of brighter contrast than for Example 2.1, suggesting lower resistivity than the material deposited in Example 2.1. The deposited insulative material was calculated to have a bulk resistivity across the 1 µm gap of approximately 800 KΩ-cm.

EXAMPLE 2.3

Deposition parameters for this example were the same as for Example 2.1, except that the DBTS partial pressure was set to 2e-5 Torr and the ammonium carbonate partial pressure was set to 3e-5 Torr, giving a 2:3 chamber-pressure partial pressure ratio between the two components of the gas mixture (less DBTS than ammonium carbonate).

The deposition rate appeared to be much less than for Example 2.1. The deposited material appeared in a FIB image to be of darker contrast than for Example 2.1, suggesting higher resistivity than the material deposited in Example 2.1. The deposited insulative material was calculated to have a bulk resistivity across the 1 µm gap of not less than 200 MΩ-cm. (Resistance measurements vary with applied bias voltage. With an applied bias of one to ten volts, the leakage current was on the order of tens of picoAmperes. It is believed that a portion of the leakage current is contributed by leakage through paths other than the deposited insulator, so the actual bulk resistivity of the deposited insulator is believed to be greater than the calculated value. The intrinsic resistance between conductors 805 and 810 of the test structure shown in FIG. 8 is typically 400 GΩ to 500 GΩ prior to deposition and without cleaning the surface of possible contaminants by FIB etching.)

EXAMPLE 2.4

Deposition parameters for this example were the same as for Example 2.1, except that the scanning box was 4 µm×4 µm and the deposition time was 10 minutes. Scanning with 250 pA beam current over the 4 µm×4 µm region, the average beam-current density was 15.6 pA/µm$^2$. (Each 500-line scan of the region is performed in 30 msec, independent of the specified size of the region. Average beam-current density is defined as the ratio of instantaneous beam current to the scanning area.)

Other than a small ridge of material deposited around the periphery of the region, the FIB basically etched the surface of the test structure without depositing insulative material.

EXAMPLE 2.5

Deposition parameters for this example were the same as for Example 2.1, except that the scanning box was 10 µm×10 µm and the deposition time was 10 minutes. Scanning with 250 pA beam current over the 10 µm×10 µm region, the average beam-current density was 2.5 pA/µm$^2$. (Each 500-line scan of the region is performed in 30 msec, independent of the specified size of the region.)

Thickness of the 10 µm×10 µm pad deposited was estimated at approximately ¼ µm to ⅓ µm. Deposition rate of the insulative material was approximately 2.5 µm$^3$ per minute.

EXAMPLE 2.6

A 5 µm×5 µm pad 800 of insulator material was deposited to a thickness of approximately 2 µm by directing a focused gallium (Ga) ion beam of 250 pA beam current at 30 keV beam energy for 10 minutes while a precursor gas of DBTS only was delivered onto a localized region of the device surface through a 10 cm long gas injector having an 0.8 mm inside diameter. Partial pressure of the DBTS gas was set to 2e-5 Torr chamber pressure. The tip of the injector was maintained at a distance of 0.5 mm from the device surface. Deposition rate of the insulative material was approximately 5 µm$^3$ per minute.

The deposited pad was observed to grow more quickly than in Examples 2.1–2.5 (i.e., more quickly than with a mixture of DBTS and ammonium carbonate gases). The deposited material appeared in a FIB image to be of brighter contrast than for Examples 2.1–2.5, suggesting lower resistivity than the material deposited in Examples 2.1–2.5. The deposited insulative material was calculated to have a bulk resistivity across the 1 µm gap of approximately 100 KΩ-cm to 200 KΩ-cm.

Experiments using a mixture of DBTS and ammonium carbonate with each gas of the mixture set to a partial pressure of 1.5e-5 Torr (rather than 3e-5 Torr as in Example 2.1) suggest that only the effective deposition rate is varied, therefore limiting the maximum beam current that could be used for a given insulator deposition operation.

Trials using a mixture of DBTS and ammonium carbonate were conducted to create a probe pad for passing a signal conductor through a power plane, as illustrated in FIGS. 1A–1D and 2A–2D. In one such trial, the insulative material (125) was deposited using a Ga-ion FIB and a 1:1 ratio of DBTS to ammonium carbonate, an opening (130) was milled, and conductive material (135) containing metal and carbon was deposited. A defect in the deposited conductive material (135) caused it to violently explode when voltage was applied, leaving the deposited insulative material (125) in place. Subsequent examination revealed no damage to the deposited insulative material, suggesting that the deposited insulative material is quite hard and capable of withstanding physical abuse. Other evidence suggests likewise.

Trials were also conducted in which a mixture of DBTS and ammonium carbonate was used with a Ga-ion FIB to deposit insulative material over conductive material previously deposited using the Ga-ion FIB. Such conductive material typically contains metal and carbon, with less than 50% metal content, and responds to an applied FIB as if soft and amorphous and by demonstrating increased electrical resistance. To minimize damage to such conductive material during the deposition of insulator material, it is useful to first deposit over the conductive material a thin layer of insulative material at low average beam-current density (e.g., as in Example 2.5) before depositing insulative material at a higher average beam-current density (e.g., as in Example 2.1).

Parameters affecting insulator deposition process with a mixture of DBTS and ammonium carbonate are summarized as follows:

Average Beam-Current Density. Material deposition appears to be optimized, in terms of insulating quality and deposition rate, with an average beam-current density between 3 pA/$\mu$m$^2$ and 5 pA/$\mu$m$^2$, with an acceptable range between 1 pA/$\mu$m$^2$ and 15 pA/$\mu$m$^2$. When exceeding 15 pA/$\mu$m$^2$ there appears to be no net deposition but instead etching by the FIB. Below 1 pA/$\mu$m$^2$, the deposition process is prohibitively slow and also results in more implanted Ga ions per/$\mu$m$^3$, thus lowering the effective resistance of the deposited material.

Absolute and Relative Gas Pressures. Material deposition appears to be optimized with the partial pressure of each of the DBTS and ammonium carbonate gases set to 3e-5 Torr, providing a 1:1 partial pressure ratio of DBTS to ammonium carbonate.

Deposition using a DBTS to ammonium carbonate partial-pressure ratio of 3:2 produced a sample with qualities that approached those of a sample deposited with DBTS alone, i.e., appearing lighter in relative contrast in a FIB image and having poorer insulating characteristics. Deposition using a DBTS to ammonium carbonate partial-pressure ratio of 2:3 produced a sample having low relative contract in a FIB image and having good insulating quality, but the overall deposition rate was proportionally slower than with a 1:1 partial-pressure ratio. A 1:1 partial-pressure ratio offers an optimal deposition rate with good quality insulator.

Figure 9:
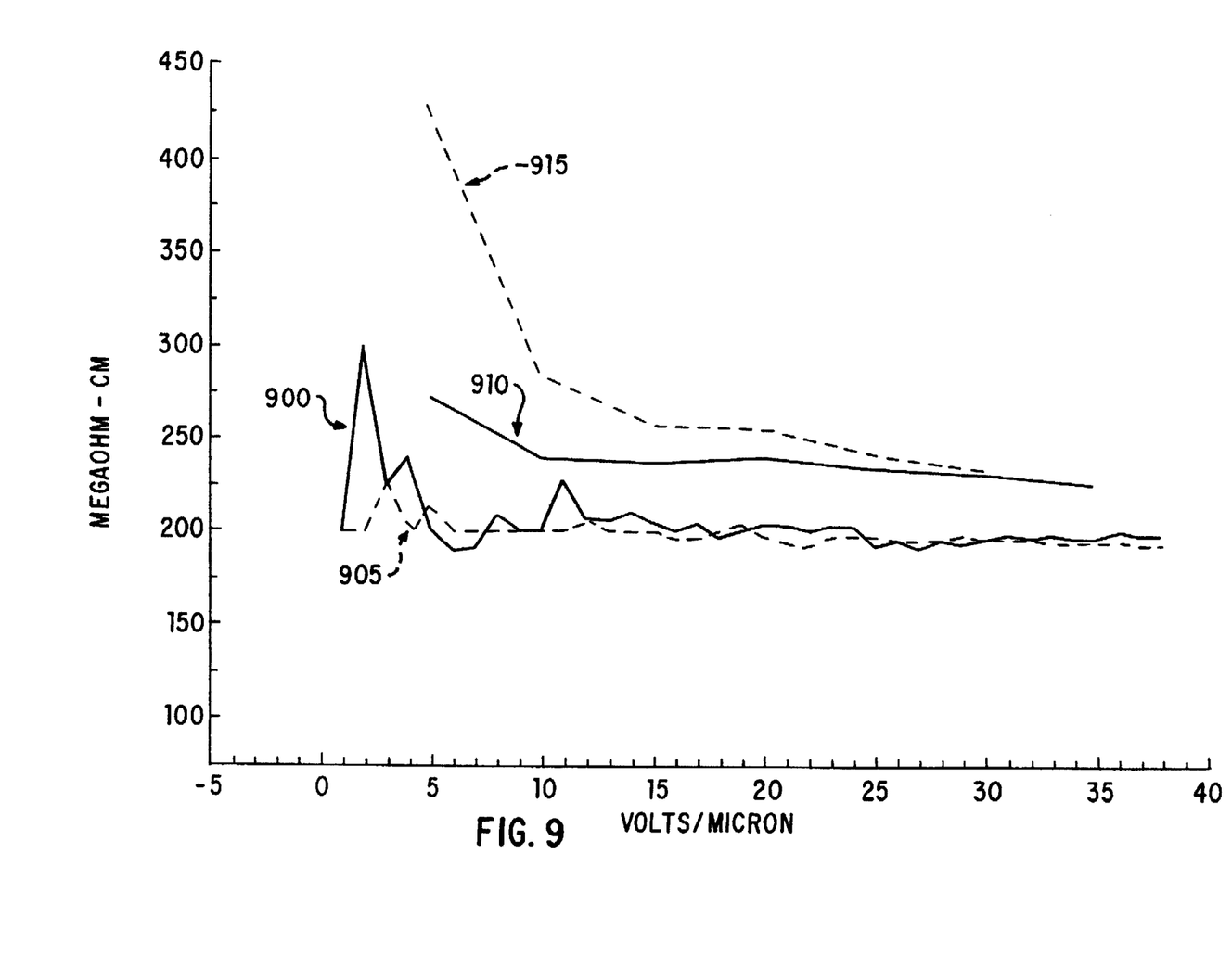
FIG. 9 shows the relationship between bulk resistivity and applied bias voltage for two insulator samples deposited in accordance with the invention.

Bulk Resistivity Measurements. FIG. 9 shows the relationship between bulk resistivity (M$\Omega$-cm) and applied bias voltage (volts/$\mu$m) for two insulator samples of 6 $\mu$m×6 $\mu$m deposited as in Example 2.1 across a 1 micron ($\mu$m) gap between two aluminum traces to a thickness of approximately 1.5 $\mu$m. For each sample, a first set of measurements was taken (curve 900 for the first sample, curve 910 for the second sample), the bias voltage was held at 20 volts for 2 minutes, and then a second set of measurements was taken (curve 905 for the first sample, curve 915 for the second sample). Bulk resistivity values of 200 M$\Omega$-cm are typical. Values obtained With these and other samples range from about 100 M$\Omega$-cm to about 300 M$\Omega$-cm. The absolute value of resistance measured for the geometry of the samples deposited was approximately 200 GigOhms (G$\Omega$). Since the test IC exhibits an intrinsic resistance of approximately 400 G$\Omega$ to 500 G$\Omega$ between the conductors prior to deposition of the insulative material, the calculated bulk resistivity values are believed to be lower than the real bulk resistivity of the deposited insulative material. It appears that for specific applications the quality of deposited insulator can be traded off against deposition rate by adjusting the ratio of DBTS to ammonium carbonate and/or the beam current. Heating the deposited insulative material for a period of time (see below) significantly improves its insulating capabilities, affording another method to increase the quality of the insulator while maintaining a maximum deposition rate.

Maximum Breakdown Field. Dozens of samples deposited across a 1 $\mu$m gap have been tested with up to a 40 volt potential applied across them, without any samples breaking down. Two samples were tested to breakdown, one of which was baked (see below) and the other of which was not baked. Both samples were stable up to an applied voltage of 90 volts, and breakdown of both samples occurred between 90 volts and 100 volts. This corresponds to a breakdown field of 90 million volts per meter.

Effective Volumetric Deposition Rates. An average beam-current density of 1 pA/$\mu$m$^2$ to 10 pA/$\mu$m$^2$ and a 1:1 gas pressure ratio with a system pressure of 3e-5 Torr results in a deposition rate of about 2 $\mu$m$^3$/minute to more than 15 $\mu$m$^3$/minute. This has been verified over sample sizes ranging from 6 $\mu$m×6 $\mu$m at a beam current of 250 pA, to 70 $\mu$m×70 $\mu$m at a beam current of 6,000 pA. Samples have been grown with thicknesses from 0.5 $\mu$m to 4 $\mu$m with no indication that thicker samples could not be grown with more time. A typical deposition for electrical analysis might be to use a 250 pA beam current for 20 minutes over a 6 $\mu$m×24 $\mu$m sample size, resulting in a deposited-material thickness of approximately 1.7 $\mu$m.

Figure 10:
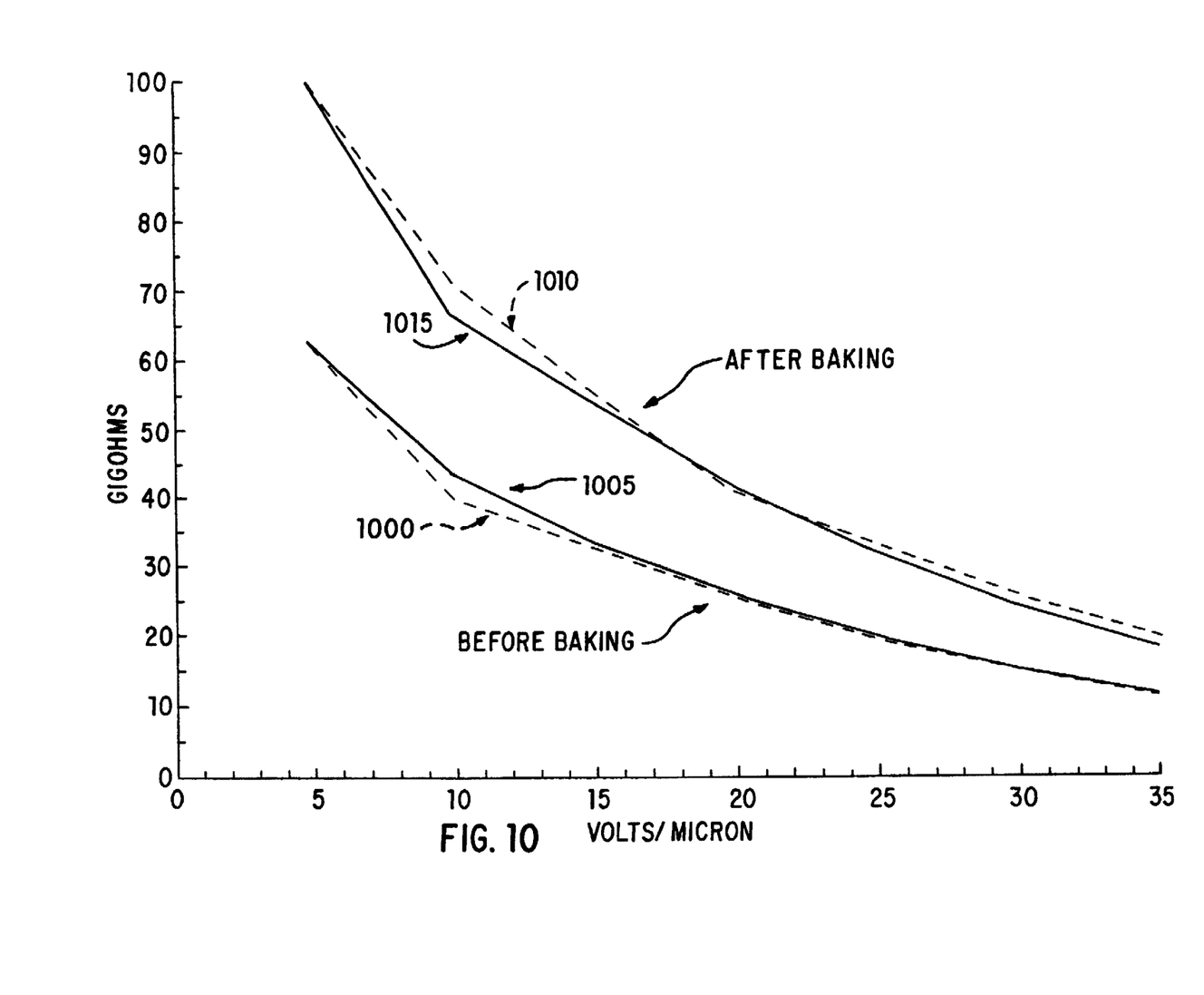
FIG. 10 shows the resistance of two identical samples of deposited insulative material before and after baking in accordance with the invention.

Effect of Baking a Deposited Insulator Sample. After a sample has been deposited and its characteristic resistance measured the effects of baking the sample in an atmospheric oven have been investigated. It has been demonstrated repeatedly that heating the sample to a temperature in excess of 100° C. results in an increase in the samples resistivity of from 2 to 5 times that before baking. FIG. 10 shows the resistance of two identical 6 $\mu$m×12 $\mu$m samples in G$\Omega$ vs. volts/$\mu$m measured before baking and after baking at 150° C. for 5 hours. Curves 1000 and 1005 show the measured resistances of the first and second samples, respectively, before baking. Curves 1010 and 1015 show the measured resistances of the first and second samples, respectively, after baking. The resistances improved slightly more when the baking temperature is increased to 150° C. rather than to some lower temperature above 100° C. Baking for much more than 5 hours does not appear to further increase the resistance. It is believed that substantially the same results may be achieved with less than a 5 hour baking time. Baking is expected to assist in making a more durable sample that can better withstand further processing in conventional semiconductor industry testing and manufacturing equipment.

Figure 11:
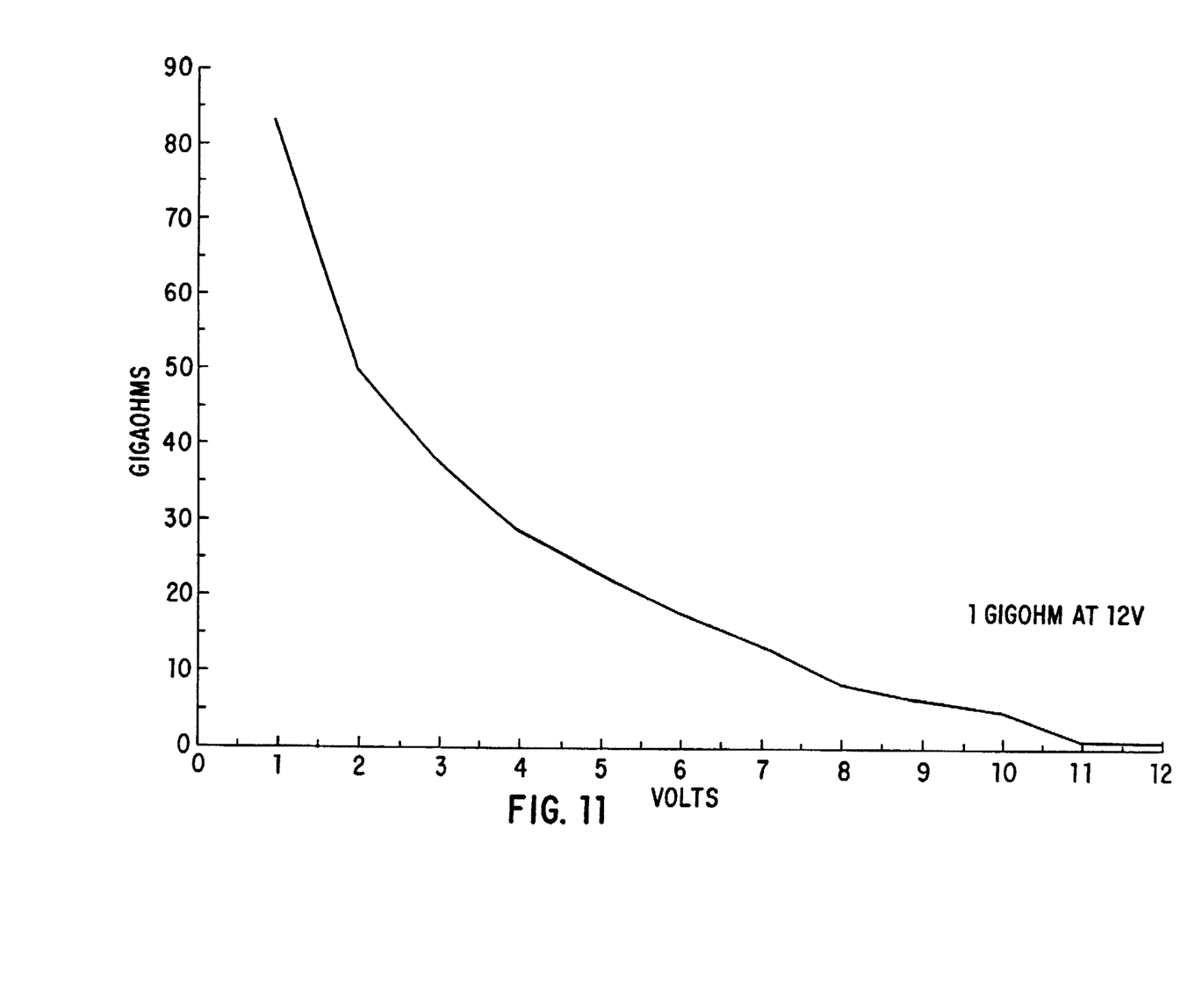
FIG. 11 shows measured resistance between the signal conductor and the power plane after depositing insulative material and conductive material to bring a signal conductor through a power plane in accordance with the invention.

Proof of Concept of Insulator Quality. As a functional test of the insulator material we used the insulator process in conjunction with other FIB processes of depositing metal-containing conductive material and halogen-enhanced etching to allow access to a metal trace lying beneath a power-plane, as illustrated in FIGS. 1A–1D and 2A–2D. The resistance measured between the signal conductor and the power plane was determined to be from 80 G$\Omega$ at 1-volt applied potential to 1 G$\Omega$ at a 12-volts applied potential, as shown in FIG. 11. The sample did not break down at 12 Volts. It was necessary to protect against stray-current paths over the surface of the device in order to accurately measure the resistance of the deposited insulator material. To this end, it was useful to "cap" (locally re-passivate with insulator material) any exposed areas near this operation that could serve to sink the applied measuring voltage.

Table 1 is a summary of useful ranges and optimum/typical values for FIB-assisted deposition of insulative material using an injected precursor gas mixture of DBTS and ammonium carbonate.

TABLE 1

| Parameter | Range of Values | Optimum/Typical Value |
|---|---|---|
| Average Beam-Current Density | 1–15 pA/$\mu m^2$ | 3–5 pA/$\mu m^2$ |
| Total Gas Pressure | 1.5–3.5 × $10^{-5}$ Torr | 3.0 × $10^{-5}$ Torr |
| Gas Partial-Pressure Ratios | 2:3–3:2 (DBTS:$(NH_3)_2CO_3$) 1:1 (as measured by chamber pressure -- see text) | |
| Bulk Resistivity (with optimum values) | 100–300 M$\Omega$-cm more than | 200 M$\Omega$-cm |
| Maximum Electrostatic Breakdown Field | Approximately 90 Volts per micron | |
| Deposition Rates | 2–15 $\mu m^3$/minute | 10 $\mu m^3$/minute |
| Signal Through Power Plane | 80 G$\Omega$ @ 1 volt 1 G$\Omega$ @ 12 Volts | Resistance between power-plane and signal |

Other Process Modifications

The insulator deposition techniques describe above can be modified in a variety of ways. The modifications described below are not mutually exclusive.

The device can be baked in an oxygen-rich environment (e.g., in air) to improve the resistivity of the deposited insulator material. The improved resistivity is believed to be due to capture of free gallium ions in the deposited material with oxygen atoms and/or halogen atoms. Baiting is performed at a temperature above room temperature, e.g., above 25° C.

The ratio of gases in the injected mixture can be changed. For example, the ratio of $CBr_4$ to DBTS of between about 1:1 and about 1:2 has been found to work well, and a range of from 1:10 to 10:1 is expected to be useful.

The gases need not be mixed in a manifold and injected as a mixture from a single needle as in the examples described above, but may be injected independently through separate needles aimed so as to produce a gas mixture on or near the surface in the localized region over which the FIB is scanned.

The average beam-current density can be changed. An advantage of using lower average beam-current density to deposit insulator material is that the ratio of the amount of gas to the number of incoming gallium ions is higher. Fewer gallium ions per volume of gas is believed to result in a lower number of gallium ions in the deposited material which are not bound (electrically neutralized) by the reactive gas, and therefore to produce deposited insulator material of higher resistivity. The only apparent disadvantage of using lower average beam-current is that the rate of deposition is lower than for average higher beam-current density. Average beam-current densities in the range of about 1 pA/$\mu m^2$ to about 1 pA/$\mu m^2$ are contemplated within the present invention.

The beam energy can be changed. It has been demonstrated that high beam energy results in low resistivity of deposited material. Beam energies in the range of 5 kev to 40 kev are contemplated within the present invention.

It appears from inspection of FIB cross-section images that deposition of insulator material using a mixture of DBTS gas and $CBr_4$ gas with a gallium-ion beam may be more effective if the deposition is begun over a region of native $SiO_2$ than over a region of native $Si_3N_4$. This is believed to be because the native $SiO_2$ acts as a seed for further SiOx deposition. The deposition process can thus be enhanced by removing the native $Si_3N_4$ passivation layer to expose the native $SiO_2$ in a region on which insulator material is to be deposited, before beginning insulator deposition. The insulative quality of material deposited using ammonium carbonate and DBTS does not appear to be substrate dependent.

Those of skill in the art will recognize that these and other modifications can be made within the spirit and scope of the invention as defined in the claims which follow.

We claim:

1. A method of depositing material on an integrated circuit, comprising:
   a. placing an integrated circuit in a vacuum chamber,
   b. applying to a localized surface region of the integrated circuit at which insulator material is to be deposited, a first gas containing molecules of a dissociable compound comprising atoms of silicon and oxygen and a second gas containing molecules of a compound which reacts with metal ions;
   c. generating a focused ion beam having metal ions of sufficient energy to dissociate molecules of the first gas; and
   d. directing the focused ion beam at the localized surface region to dissociate at least some of the molecules of the first gas and to thereby deposit on at least a portion of the localized surface region a material containing atoms of silicon and oxygen.

2. The method of claim 1, wherein the dissociable compound further comprises atoms of carbon and hydrogen.

3. The method of claim 1, wherein the compound which reacts with metal ions comprises a halide.

4. The method of claim 3, wherein the halide comprises carbon tetrabromide ($CBr_4$).

5. The method of claim 1, further comprising the step of baking the integrated circuit at a temperature in excess of 25° C.

6. The method of claim 1, wherein the metal ions have an energy in the range of 5 kev to 40 kev.

7. The method of claim 1, wherein the focused ion beam is generated from a liquid metal ion source of Gallium ions.

8. A method of depositing material on an integrated circuit, comprising:
   a. placing an integrated circuit in a vacuum chamber,
   b. applying to a localized surface region of the integrated circuit at which insulator material is to be deposited, a first gas containing molecules of di-t-butoxydiacetoxysilane (DBTS) and a second gas containing molecules of a compound which reacts with metal ions;
   c. generating a focused ion beam having metal ions of sufficient energy to dissociate molecules of the first gas; and
   d. directing the focused ion beam at the localized surface region to dissociate at least some of the molecules of the first gas and to thereby deposit on at least a portion of the localized surface region a material containing atoms of silicon and oxygen.

9. The method of claim 8, wherein the compound which reacts with metal ions comprises one of carbon tetrabromide ($CBr_4$) or ammonium carbonate (($NH_3$)$_2CO_3$).

10. The method of claim 8, wherein the compound which reacts with metal ions comprises ammonium carbonate ($NH_3)_2CO_3$) and wherein the focused ion beam is scanned over the localized surface region at an average beam-current density of about 1 pA/μm² to about 15 pA/μm².

11. The method of claim 10, wherein the total gas pressure in the vacuum chamber of the first gas and the second gas is between about $1.5 \times 10^5$ Torr and about $3.5 \times 10^{-5}$ Torr.

12. The method of claim 11, wherein the gas partial-pressure ratio of the first gas to the second gas is between about 2:3 and about 3:2.

13. The method of claim 11, wherein the gas partial-pressure ratio of the first gas to the second gas is 1:1.

14. A method of depositing material on an integrated circuit, comprising:

a. placing an integrated circuit in a vacuum chamber, b. applying to a localized surface region of the integrated circuit at which insulator material is to be deposited, a first gas containing molecules of di-t-butoxydiacetoxy-silane (DBTS) and a second gas containing molecules of carbon tetrabromide ($CBr_4$), wherein the gas partial-pressure ratio of carbon tetrabromide to di-t-butoxydiacetoxy-silane is between about 1:1 and about 1:2;

c. generating a focused ion beam having metal ions of energy between about 5 kev and about 40 kev; and d. directing the focused ion beam at the localized surface region to dissociate at least some of the molecules of the first gas and to thereby deposit on at least a portion of the localized surface region a material containing atoms of silicon and oxygen.

* * * * *